United States Patent
Patzer et al.

(10) Patent No.: US 9,111,756 B2
(45) Date of Patent: Aug. 18, 2015

(54) INTEGRATED CIRCUITS WITH PROTECTED RESISTORS AND METHODS FOR FABRICATING THE SAME

(71) Applicant: GLOBALFOUNDRIES, Inc., Grand Cayman (KY)

(72) Inventors: Joachim Patzer, Langebrueck (DE); Hans-Peter Moll, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 100 days.

(21) Appl. No.: 14/033,789

(22) Filed: Sep. 23, 2013

(65) Prior Publication Data

US 2015/0084183 A1 Mar. 26, 2015

(51) Int. Cl.
*H01L 21/44* (2006.01)
*H01L 21/033* (2006.01)
*H01L 21/768* (2006.01)

(52) U.S. Cl.
CPC ...... *H01L 21/0332* (2013.01); *H01L 21/76886* (2013.01)

(58) Field of Classification Search
CPC .................... H01L 27/0629; H01L 28/20
USPC ............................ 257/734; 438/682
See application file for complete search history.

(56) References Cited

U.S. PATENT DOCUMENTS

| | | | |
|---|---|---|---|
| 6,730,554 B1 * | 5/2004 | Baldwin et al. | 438/210 |
| 6,936,520 B2 * | 8/2005 | Yamanoue et al. | 438/383 |
| 8,748,256 B2 * | 6/2014 | Zhao et al. | 438/238 |
| 8,969,151 B2 * | 3/2015 | Tan et al. | 438/238 |
| 2014/0061813 A1 * | 3/2014 | Yu et al. | 257/369 |

* cited by examiner

*Primary Examiner* — Lex Malsawma
*Assistant Examiner* — Patricia Reddington
(74) *Attorney, Agent, or Firm* — Ingrassia Fisher & Lorenz, P.C.

(57) ABSTRACT

Methods and apparatus are provided for an integrated circuit with a transistor and a resistor. The method includes depositing a first dielectric layer over the transistor and the resistor, followed by an amorphous silicon layer. The amorphous silicon layer is implanted over the resistor to produce an etch mask, and the amorphous silicon layer and first dielectric layer are removed over the transistor. A contact location on the transistor is then silicided.

15 Claims, 7 Drawing Sheets

INTEGRATED CIRCUITS WITH PROTECTED RESISTORS AND METHODS FOR FABRICATING THE SAME

TECHNICAL FIELD

The technical field generally relates to integrated circuits and methods for fabricating integrated circuits, and more particularly relates to integrated circuits with resistors and transistors, where the resistors are protected by an etch mask while the transistors are silicided, and methods for fabricating the same.

BACKGROUND

Integrated circuits include many electronic components connected in various ways. A field effect transistor (FET) is a type of electrical component having a source, a drain, a gate, and associated electrical contacts. In many embodiments, the surface of the transistor is silicided prior to forming an electrical contact as the silicided surface is very conductive and improves the electrical connection at the transistor. As integrated circuits become smaller, the area of the silicided surface becomes smaller, so the integrity and quality of the silicided surface becomes more important.

Resistors are required in many electrical circuits for various purposes, e.g. as voltage dividers or as fuse resistors. The resistors are designed and built for a particular resistance, and proper operation of the electrical circuit depends on the expected target resistance and specifications for the resistor being fulfilled. Several types of resistors are common in integrated circuits, such as silicided resistors that have a lower resistivity and non-silicided resistors with a higher resistivity. Therefore, non-silicided resistors are typically protected while the contact locations on the transistors are silicided. This can involve covering both the transistors and the resistors with various layers, which are typically dielectric materials, and then removing the layers over the transistor for the siliciding process. However, transistors are being placed closer and closer together to develop smaller and smaller integrated circuits, and this creates smaller gaps between the gates of adjacent transistors. As the gates are placed closer together, it is becoming more difficult to remove all of the dielectric material between adjacent gates, especially when the covering layers are so thick that they can merge in the space between adjacent transistor gates. This can result in incomplete removal of the dielectric layer between the gates, which produces dielectric residuals on surfaces of the transistor. The dielectric residuals can interfere with the siliciding process, which in turn interferes with the electrical connection between the transistor and other electrical components. Increasing the etching process to remove the dielectric residuals results in undesirable, excessive etching on other components of the integrated circuit.

Accordingly, it is desirable to develop new systems and methods for protecting resistors while transistors are silicided. In addition, it is desirable to develop new integrated circuits with thin protective layers over the resistors. It is also desirable to develop systems and methods to lower the likelihood of dielectric residuals on transistors prior to siliciding the transistor contact locations. Furthermore, other desirable features and characteristics of the present embodiment will become apparent from the subsequent detailed description and the appended claims, taken in conjunction with the accompanying drawings and this background.

BRIEF SUMMARY

In an exemplary embodiment, a method is provided for producing an integrated circuit with transistors and resistors. A first dielectric layer is deposited over the transistor and the resistor, followed by an amorphous silicon layer. The amorphous silicon layer is implanted over the resistor to produce an etch mask, and the amorphous silicon layer and first dielectric layer are removed over the transistor. A contact location on the transistor is then silicided.

In an alternate exemplary embodiment, a method is provided for producing an integrated circuit with transistors and resistors. The resistor is protected with an etch mask and a first dielectric layer, where the first dielectric layer is between the resistor and the etch mask. The etch mask has a thickness of no more than about 200 angstroms. The transistor is exposed, and a contact location on the transistor is silicided.

An integrated circuit is provided in yet another exemplary embodiment. The integrated circuit includes a transistor and a resistor overlying a substrate. A first dielectric layer is overlying the resistor, and a carbon doped amorphous silicon etch mask is overlying the first dielectric layer.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the application and uses of the embodiment described. Furthermore, there is no intention to be bound by any theory presented in the preceding background or the following detailed description. The various tasks and process steps described herein may be incorporated into a more comprehensive procedure or process having additional steps or functionality. Various steps in the manufacture of semiconductor based integrated circuits are well known and so, in the interest of brevity, many conventional steps will only be mentioned briefly herein or will be omitted entirely without providing the well-known process details.

Transistors and resistors are often electrically isolated from each other by silicon oxide in a shallow trench isolation, and these different electronic components are processed in different manners. Contact surfaces of transistors are often converted to a highly conductive metal silicide before making an electrical connection. A metal is deposited on the contact surface and thermally annealed to form the metal silicide, but the metal will form a silicide with other materials containing silicon as well. Many resistors include silicon, and the formation of a metal silicide changes the designed resistance of the resistor. The resistor is protected from the siliciding process with a protective etch mask that also serves as a siliciding mask. A first dielectric layer is deposited over the transistor and the resistor, followed by an amorphous silicon layer. A photoresist is used to shield the amorphous silicon over the transistor, and an etch mask is created over the resistor by implanting the amorphous silicon with an implant material. The transistor is then exposed by removing the overlying layers. The amorphous silicon layer can be essentially completely removed without damaging other areas of the integrated circuit, and without removing the etch mask, which reduces the propensity for dielectric residuals between adjacent transistor gates. The transistor is then cleaned and a metal silicide is formed at desired contact locations. The implanted amorphous silicon layer shields the resistor from the siliciding process, and the first dielectric layer under the amorphous silicon layer isolates the resistor from the implanted amorphous silicon layer.

Figure 1:
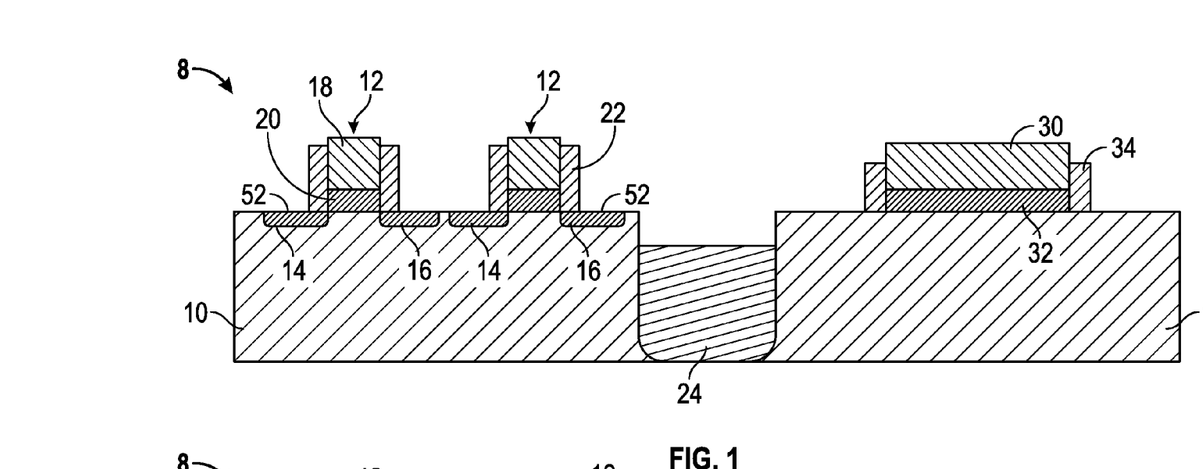
FIGS. 1-9 illustrate in cross sectional views a method of manufacture of an integrated circuit.

FIG. 1 illustrates an exemplary embodiment of an integrated circuit 8 having a substrate 10 with a pair of transistors 12 and a resistor 30 coupled to the substrate 10. The transistor 12 has a source 14 and a drain 16 in the substrate 10, with a gate 18 extending over the substrate 10. As used herein, "overlying" or "over" means "on" (such that the gate 18 physically contacts the substrate 10), or "above" (such that another material layer may lie in between the gate 18 and the substrate 10). A gate insulator 20 is located between the gate 18 and the substrate 10, and transistor sidewall spacers 22 extend from the substrate 10 past the gate insulator 20 to a point near the top of the gate 18. The substrate 10 is a semiconductor, such as crystalline silicon, but other semiconductors can also be used. A dopant is implanted into the source 14 and drain 16, where the dopant can be either a "P" or "N" type doping agent, and the source 14 and drain 16 are activated by thermal annealing. The gate 18 can include a polysilicon material, a refractory metal, or other materials. The gate insulator 20 is a dielectric, and the transistor sidewall spacers 22 are also a dielectric. For example, the gate insulator 20 may be silicon oxide, and the transistor sidewall spacers 22 may be silicon nitride, but other dielectric materials can also be used. Other embodiments of the transistor 12 are also possible. For example, different shaped transistors 12 can be utilized, such as fin shaped transistors 12.

Different regions on the substrate 10 are isolated from each other by shallow trench isolation 24 (STI). The STI 24 is formed from a dielectric material, such as silicon oxide or silicon nitride, but other dielectric materials can also be used. The embodiment shown in FIG. 1 illustrates the resistor 30 separated from the transistors 12 by an STI 24, but in other embodiments there is no STI 24 between the resistor 30 and the transistor 12. There may be other electronic components present that are not illustrated, and in some embodiments many other electronic components are present.

In one embodiment, the resistor 30 is isolated from the substrate 10 with a resistor insulator 32, and resistor sidewall spacers 34 extend from the substrate 10 past the resistor insulator 32 to a point near the top of the resistor 30. The resistor 30 can be formed from a variety of materials, such as doped crystalline silicon, doped poly silicon, or other materials. The material of the resistor 30 has a certain natural resistance to the flow of electricity, and the length, width, and thickness of the resistor 30, combined with the material of the resistor 30, determine the resistance. The resistance of the resistor 30 can be changed by either changing the material of the insulator to a more or less electrically conductive material by additional dopant implants, or by changing the dimensions of the resistor 30. Electrical connections (not shown) are made at or near opposite ends of the resistor 30, so current flows through the body of the resistor 30. Other types of resistors 30 can be used in other embodiments. For example, a portion of the substrate 10 can be doped and annealed, so the resistor 10 is embedded in the substrate 10 instead of overlying it. In embodiments where the resistor 30 is implanted and annealed, the implantation and annealing are complete at the stage illustrated in FIG. 1.

The resistance of the resistor 30 depends on the material of the resistor 30, at least in part, so a change to the material of the resistor 30 changes the overall resistance. In cases where the resistor 30 has a high resistance, such as over about 100 ohms, the addition of a highly conductive metal silicide to the resistor 30 can significantly change the overall resistance. Electrical current easily flows through the highly conductive metal silicide, and thereby lowers the resistance. The resistance of a resistor 30 of less than about 100 ohms will also be undesirably changed by a metal silicide, but not to the same degree as a high resistance resistor 30.

Figure 2:
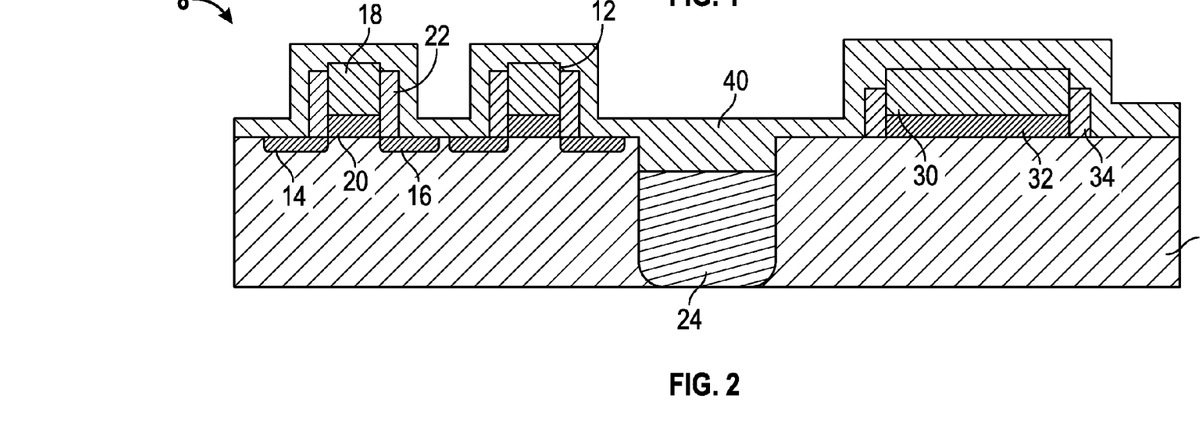
Figure 3:
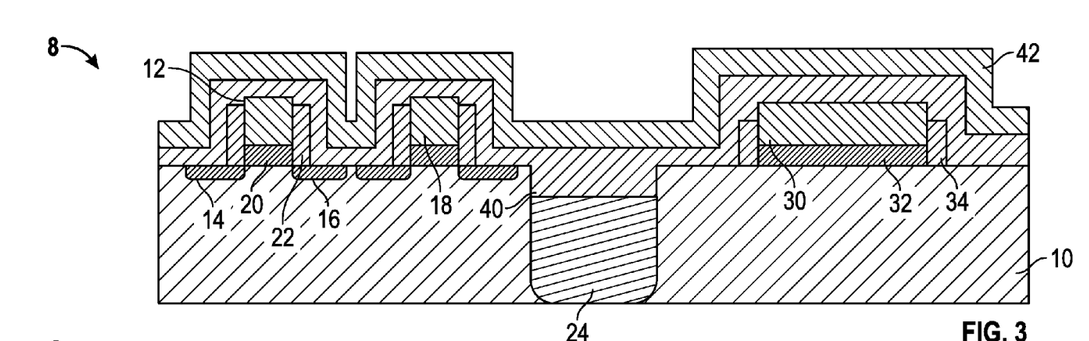

Referring now to FIG. 2, a first dielectric layer 40 is deposited over the substrate 10, the transistor 12, and the resistor 30. The first dielectric layer 40 is also deposited over the STI 24, and any other components on the substrate 10. In some embodiments, the first dielectric layer 40 is silicon dioxide, which can be deposited with chemical vapor deposition, but other types of dielectric can also be deposited. An amorphous silicon layer 42 is then deposited over the first dielectric layer 40, as illustrated in FIG. 3. The amorphous silicon layer 42 can be deposited using several different techniques, including chemical vapor deposition, plasma enhanced chemical vapor deposition, and hot wire catalytic deposition. Very thin amorphous silicon layers 42 can be deposited, with total thicknesses of about 100 angstroms or less in some embodiments, total thicknesses of about 200 angstroms or less in other embodiments, and a wide variety of other thicknesses. A thin amorphous silicon layer 42 is useful, because the amorphous silicon layer 42 does not "bridge the gap" and connect to itself between adjacent transistor gates 12, or other features that produce a tight pitch. This is seen in the "U" shape of the amorphous silicon layer 42 between the two transistors 12. If the amorphous silicon layer 42 were to bridge the gap, it would be flat across the space over and between the two transistor gates 18. However, in some embodiments, the amorphous silicon layer 42 may bridge the gap between adjacent gates 12. A thin amorphous silicon layer 42 is also desirable because it occupies less space on the integrated circuit 8, and features that occupy less space are desirable as smaller integrated circuits 8 are produced.

Figure 4:
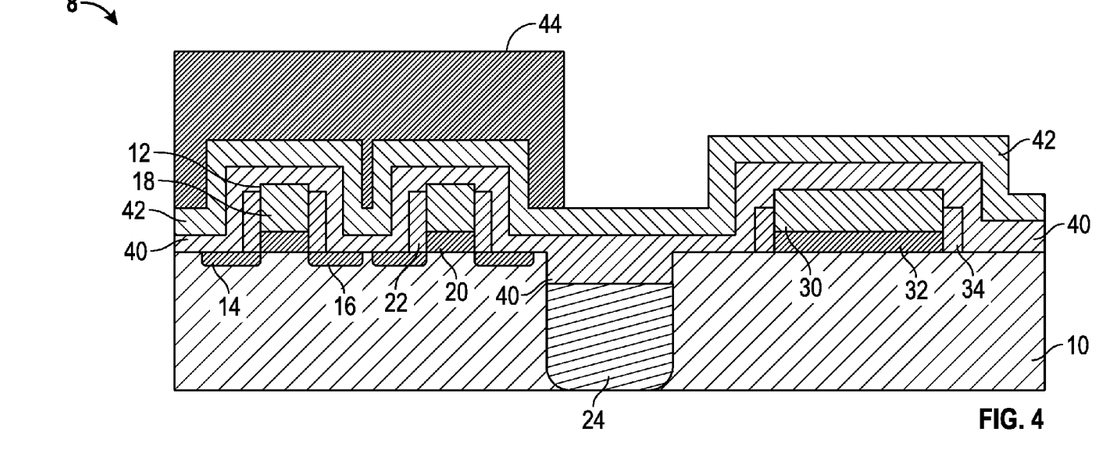

FIG. 4 illustrates a layer of etch mask photoresist 44 over the transistor 12. The etch mask photoresist 44 is deposited over the substrate 10, including the transistor 12 and resistor 30, then patterned and removed from over the resistor 30. The etch mask photoresist 44 is deposited by spin coating, and patterned using a mask and a source of light or other electromagnetic radiation. A positive or negative etch mask photoresist 44 can be used. The amorphous silicon layer 42 is exposed over the resistor 30, but the etch mask photoresist 44 protects or shields the amorphous silicon layer 42 over the transistor.

Figure 5:
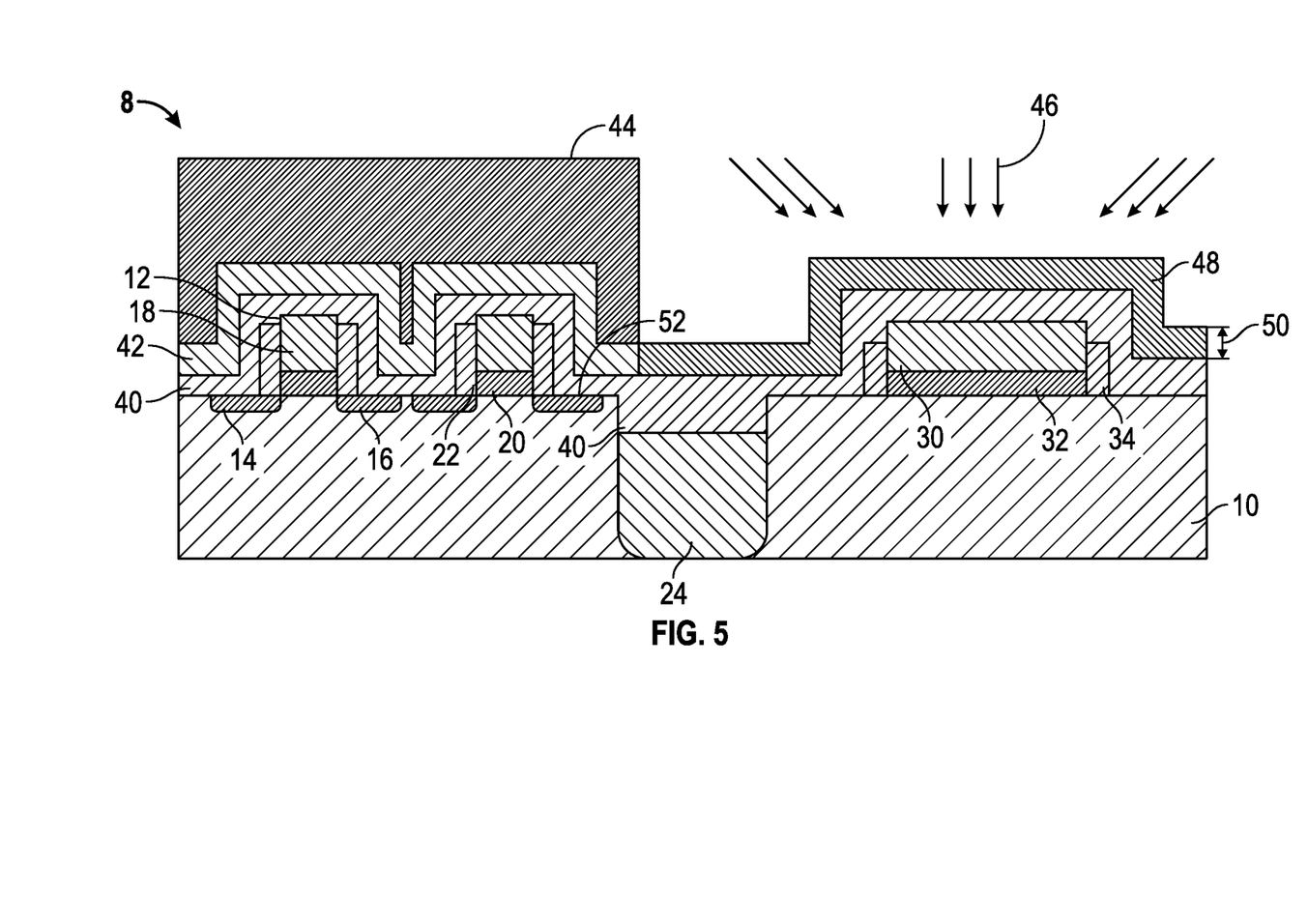

FIG. 5 illustrates an implant material 46 being implanted into the amorphous silicon layer 42 over the resistor 30. The implant material 46 changes the chemical nature of the amorphous silicon and creates an etch mask 48 from the amorphous silicon layer 42. In some embodiments, the implant material 46 is carbon, and the amorphous silicon layer 42 is converted to carbon doped amorphous silicon. Implanting the implant material 46 can also further amorphize the amorphous silicon layer 42. However, different implant materials 46, such as boron, can be used in other embodiments. It is relatively easy to control the implant process when carbon is used as the implant material 46. The implant angle is varied, so the relatively vertical portions of the etch mask 48 are implanted along with the horizontal portions over the resistor 30. The etch mask 48 is used to protect the resistor 30, and the relatively vertical side surfaces provide some of that protection. If the relatively vertical side surfaces were not implanted, the etch mask 48 could fail at those side surfaces. The implant material 46 does not penetrate the etch mask photoresist 44, so the amorphous silicon layer 42 over the transistor 12 is not implanted. The etch mask 48 has an etch mask thickness 50 that is less than 200 angstroms in some embodiments, and less than 100 angstroms in other embodiments, but other etch mask thicknesses 50 are also possible. The etch mask 48 is created from the amorphous silicon layer 42, so the etch mask thickness 50 is determined by the thickness of the amorphous silicon layer 42.

The implant material 46 can be implanted into the amorphous silicon by ion implantation. The implant energy is chosen such that the underlying first dielectric layer 40 is not penetrated by the implant material 46, so the implant energy depends on the thickness of the amorphous silicon layer 42. In some embodiments, high doses of implant material 46 are used to ensure complete transformation of the amorphous silicon layer 42 into a functional etch mask 48. Various implant materials 46 can be used, but carbon or boron difluoride (BF2) provide good wet etch rate differences compared to the unimplanted amorphous silicon layer 42. A wide variety of angles can be used for twist and tilt so the implant material 46 is implanted into vertical side surfaces facing in different directions.

Figure 6:
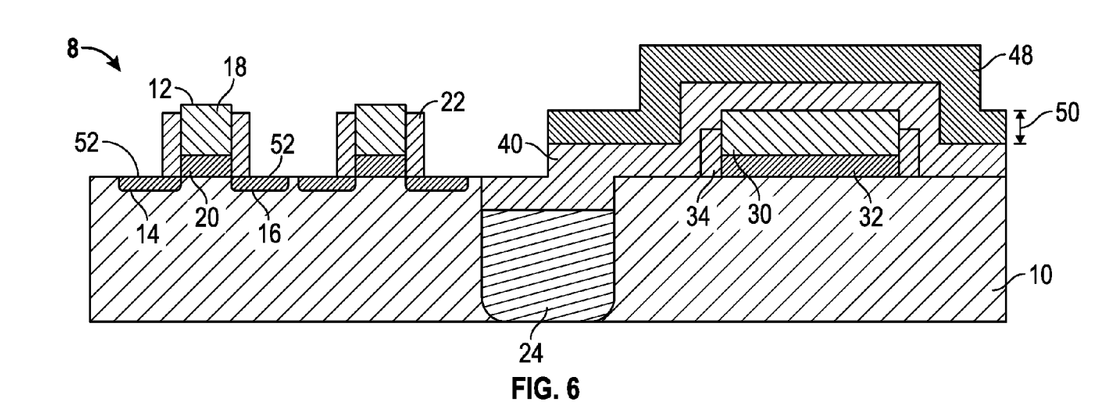

After the etch mask 48 has been created from the amorphous silicon layer 42, the various materials over the transistor 12 are removed, as illustrated in FIG. 6. The etch mask photoresist 44 can be removed with plasma etching or a wet etchant, such as organic photoresist strippers with aryl sulfonic acids. The amorphous silicon layer 42 can then be removed with an ammonia etch. Ammonia has a slow etch rate for silicon oxide, so a silicon oxide first dielectric layer 40 protects the transistor 12 from the ammonia etch. This allows for essentially complete removal of the amorphous silicon layer 42, which greatly decreases the chances of any dielectric residuals between the transistor gates 18. Ammonia also has a slow etch rate for the etch mask 48 over the resistor 30, so the etch mask 48 remains in place. Once the amorphous silicon layer 42 is removed, the first dielectric layer 40 is removed using any of several possible methods. For example, if the first dielectric layer 40 is silicon oxide, it can be removed with a hydrofluoric acid liquid etchant, which may be diluted with water or buffered and diluted with ammonium fluoride. The STI 24 may be recessed somewhat from the surface of the substrate 10, and a portion of the first dielectric layer 40 is left over the STI 24 to form a flush surface with the substrate 10. The first dielectric layer 40 over the STI 24 helps to isolate the areas of the substrate 10 on opposite sides of the STI 24, which helps prevents shorts over the STI 24.

The siliciding process will form metal silicides from any exposed surface with free silicon. Therefore, the first dielectric layer 40 is removed from all free silicon surfaces that are to be silicided, including a desired contact location 52. For example, silicon in the source 14, drain 16, and gate 18 are exposed when the first dielectric layer 40 is removed. The transistor sidewall spacers 22 are made of a dielectric material, such as silicon nitride, so no metal silicide will form on the transistor sidewall spacers 22. The desired contact location 52 is a location where an electrical contact will be formed. The etch mask 48 protects the resistor 30 from the siliciding process, so the etch mask 48 also functions as a siliciding mask. The etch mask 48 produced over the resistor 30 can also be produced over any other surfaces where a metal silicide is not wanted, so the etch mask 48 can protect electrical components other than the resistor 30 from the siliciding process. The process described above for forming the etch mask 48 is also used to protect other electrical components or surfaces from siliciding.

Figure 7:
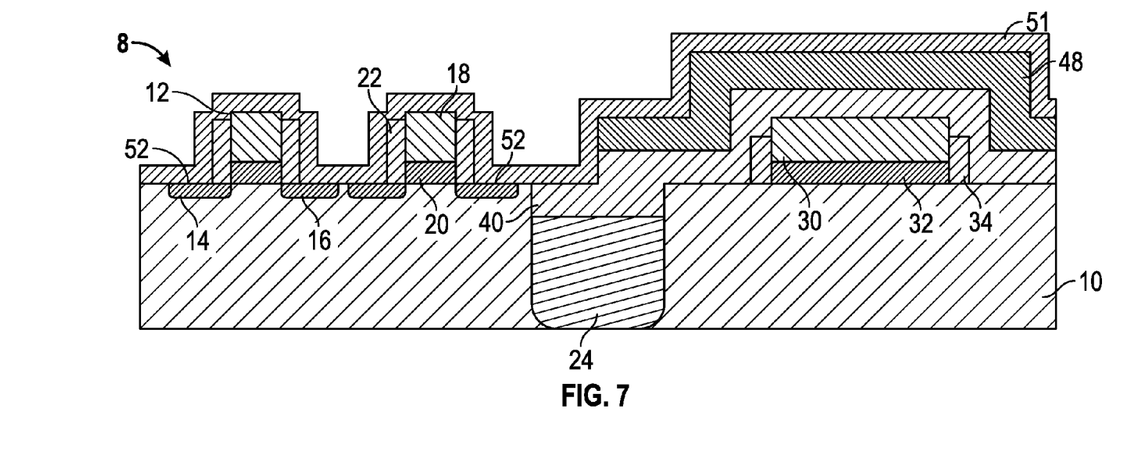

Reference is now made to FIG. 7. After the first dielectric layer 40 is removed from over the transistor 12, the surface is prepared for siliciding. The siliciding process includes several steps, including cleaning, depositing a layer of metal 51, and then annealing the contact location 52 to form the metal silicide. The exposed substrate 10, transistor 12, and etch mask 48, are cleaned with an organic solution followed by a dilute hydrofluoric acid solution, and then rinsed with deionized water and dried. Other cleaning embodiments are also possible, such as dipping the integrated circuit 8 in dilute hydrofluoric acid, followed by a drying step. The integrated circuit 8 is then optionally placed in a metal deposition chamber, and further cleaned with sputtered argon ions. A thin layer of metal 51 is then deposited on the exposed surfaces, such as by sputtering or chemical vapor deposition. Several different metals 51 can be deposited for the siliciding process, such as nickel (Ni), titanium (Ti), or cobalt (Co). After the layer of metal 51 is deposited, the metal silicides are formed by thermally annealing the contact locations 52. Annealing temperatures of about 100° C. to about 700° C. are used in some embodiments, and the annealing temperature is selected based on the metal used. In an exemplary embodiment using nickel (Ni), a two step anneal is used. The first annealing step uses temperatures from about 240° C. to about 320° C. for about 10 to about 40 seconds, and this step defines the diffusion of the Ni into the silicon material, such as polysilicon. A second annealing step is used to convert the silicon and nickel to a stable nickel-silicide phase with specific resistance values. The second annealing step uses temperatures from about 400° C. to about 500° C. for about 20 to about 40 seconds. However, in some embodiments ultra-short laser anneals are used.

Figure 8:
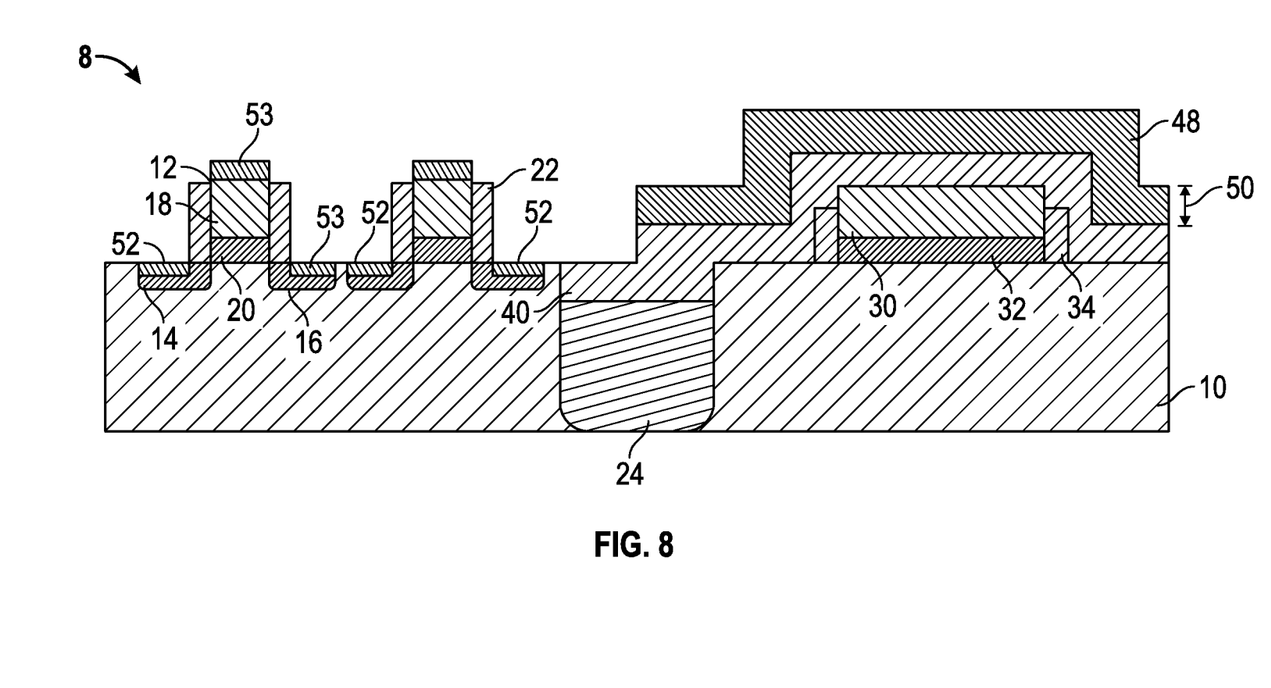

Referring now to FIG. 8, with continuing reference to FIG. 7, the metal 51 reacts with silicon to form a metal silicide 53, but the metal 51 does not react with the dielectrics or other materials. Wet etching is then used to remove the layer of metal 51 from areas where a metal silicide 53 was not formed and also any remaining metal that did not diffuse into the silicon material, such as the polysilicon. For example, nickel can be selectively etched with a mixture of nitric acid, acetic acid, and sulfuric acid. Cobalt can be selectively etched with a mixture of hydrochloric acid and peroxide. Titanium can be selectively etched with a mixture of ammonia and peroxide. Many other etchants can be used in various embodiments.

Figure 9:
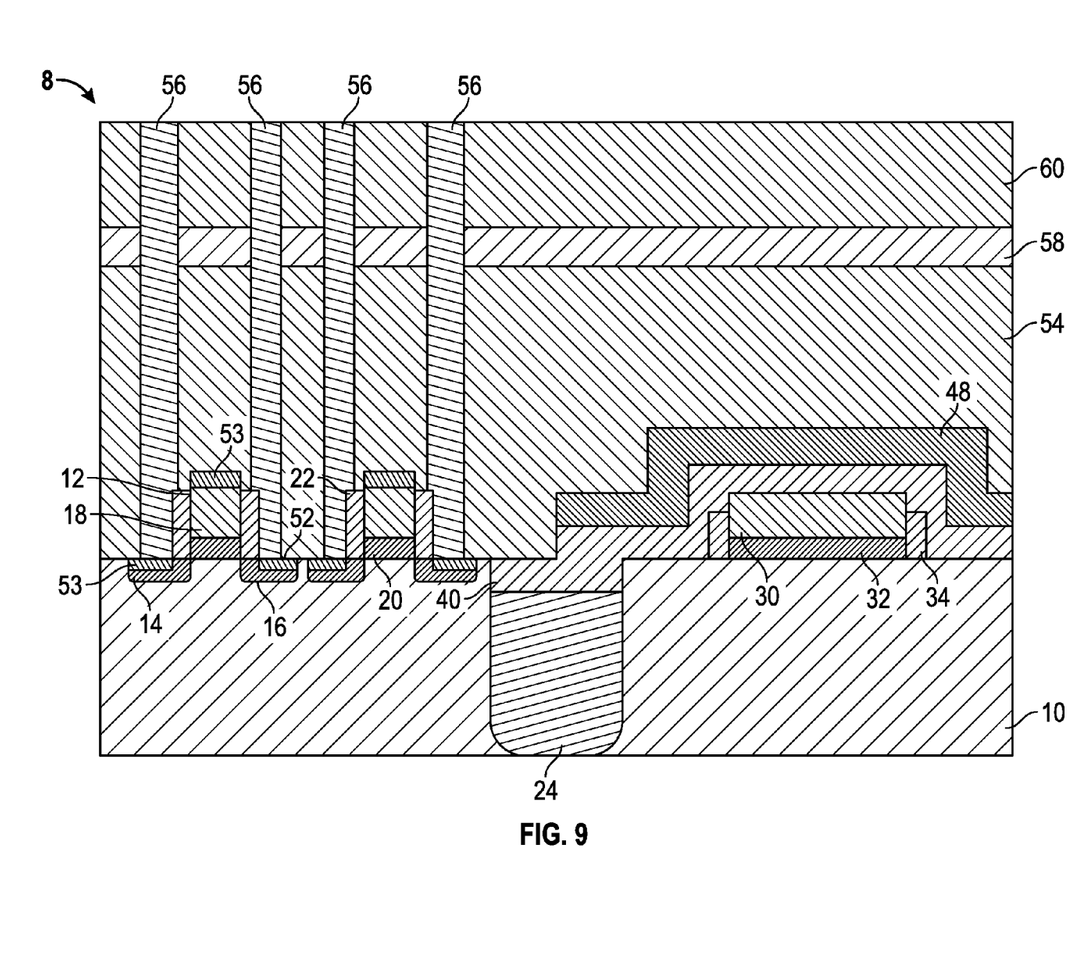

Once the contact locations 52 are silicided, an interlayer dielectric 54 is deposited over the exposed surfaces, including the substrate 10, the contact locations 52, the transistors 12, and the etch mask 48, as illustrated in FIG. 9. The interlayer dielectric 54 is silicon oxide in some embodiments, but other dielectric materials can be used in other embodiments. Silicon oxide can be deposited by chemical vapor deposition.

Figure 10:
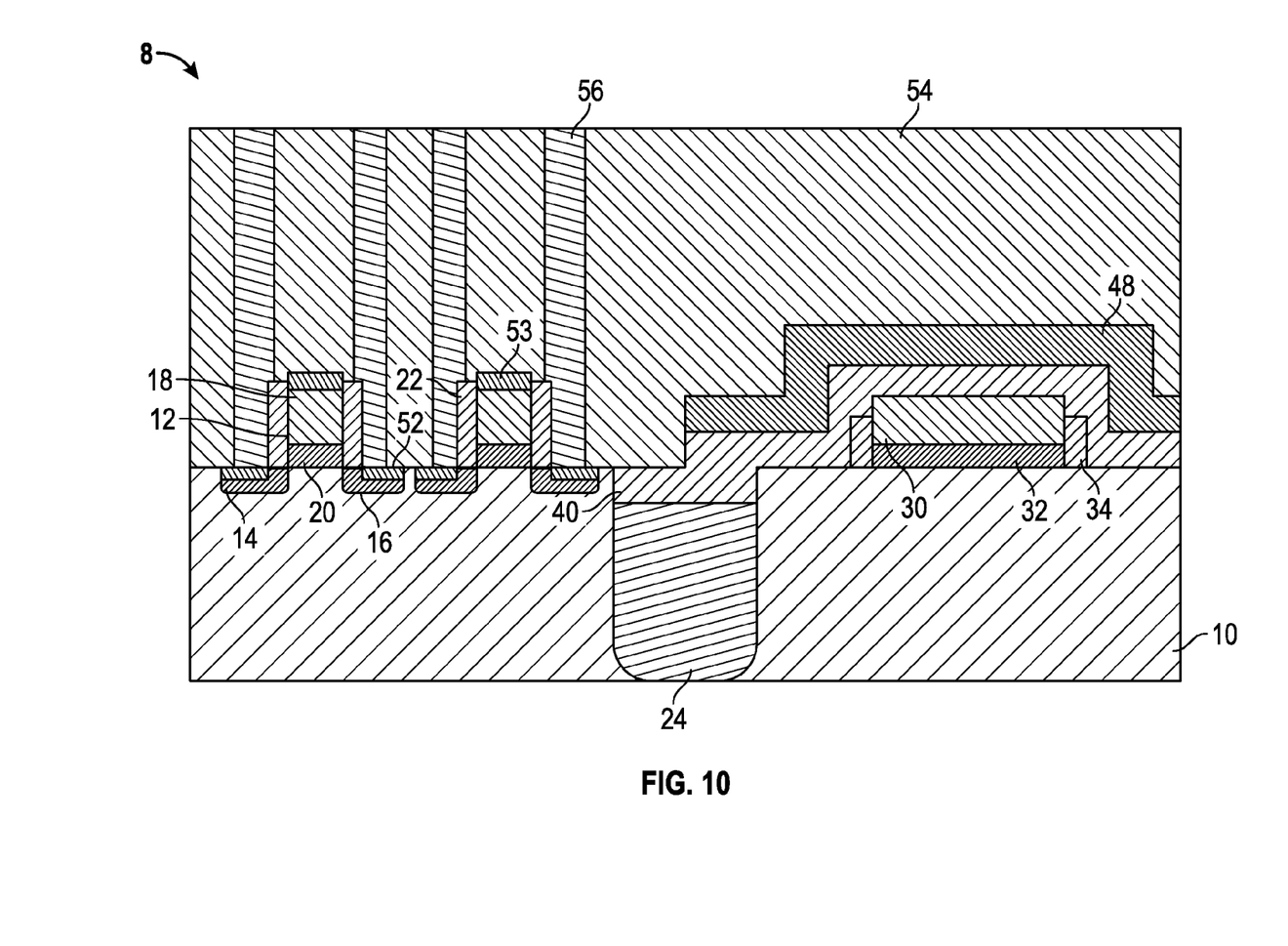
FIG. 10 illustrates a portion of the integrated circuit in cross sectional view.

A contact 56 is formed through the interlayer dielectric 54 so that it extends through the interlayer dielectric 54 and electrically connects to the metal silicide 53 at the contact location 52. The contact 56 can be formed by depositing a hard mask 58, such as titanium nitride or other materials, on top of the interlayer dielectric 54. Atomic layer deposition can be used to deposit titanium nitride for the hard mask 58. A contact photoresist layer 60 is then deposited over the hard mask 58, such as by spin coating. The contact photoresist layer 60 is patterned and a via is etched through the hard mask 58 and the interlayer dielectric 54 to the contact location 52. The contact 56 is then deposited within the via. In some embodiments, the contact 56 is formed by sequentially depositing an adhesion layer, a barrier layer, and a plug. In an exemplary embodiment, an adhesion layer of titanium is deposited by atomic layer deposition, a barrier layer of titanium nitride is deposited by atomic layer deposition, and a plug of titanium is deposited by chemical vapor deposition, but other embodiments are also possible. The contact photoresist layer 60 and hard mask 58 are then removed, as well as the portion of the contact 56 extending therethrough, as illustrated in FIG. 10. The contact 56 at the upper surface of the interlayer dielectric 54 is then available for electrical connections to other electronic components for the integrated circuit 8.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
    depositing a first dielectric layer over a resistor and a transistor of the integrated circuit;
    depositing an amorphous silicon layer over the first dielectric layer;
    implanting the amorphous silicon layer over the resistor to create an etch mask;
    removing the amorphous silicon layer and the first dielectric layer overlying the transistor while leaving the etch mask over the resistor; and
    siliciding a contact location on the transistor.

2. The method of claim 1 wherein implanting the amorphous silicon layer further comprises implanting carbon into the amorphous silicon layer to produce the etch mask comprising carbon doped amorphous silicon.

3. The method of claim 1 wherein siliciding the contact location further comprises depositing a metal on the contact location and thermally annealing the contact location.

4. The method of claim 3 wherein depositing the metal further comprises depositing the metal comprising nickel on the contact location.

5. The method of claim 1 wherein depositing the first dielectric layer over the resistor and the transistor further comprises depositing silicon oxide over the resistor and the transistor.

6. The method of claim 1 wherein implanting the amorphous silicon layer to create the etch mask further comprises:
    depositing an etch mask photoresist over the transistor and the resistor;
    patterning the etch mask photoresist; and
    removing the etch mask photoresist over the resistor while leaving the etch mask photoresist over the transistor.

7. The method of claim 1 further comprising forming a contact to the contact location after siliciding the contact location.

8. A method of producing an integrated circuit comprising:
    protecting a resistor of the integrated circuit with a first dielectric layer and an etch mask, wherein the first dielectric layer is positioned between the resistor and the etch mask, wherein the etch mask has an etch mask thickness of no more than about 200 angstroms, and wherein creating the etch mask comprises implanting an implant material into an amorphous silicon layer;
    exposing a transistor of the integrated circuit, wherein exposing the transistor comprises removing the amorphous silicon layer from over the transistor while the etch mask remains over the resistor; and
    siliciding a contact location on the transistor.

9. The method of claim 8 wherein protecting the resistor further comprises:
    depositing the first dielectric layer over the resistor; and
    depositing the amorphous silicon layer over the first dielectric layer.

10. The method of claim 9 wherein implanting the implant material further comprises implanting carbon into the amorphous silicon layer to produce the etch mask comprising carbon doped amorphous silicon.

11. The method of claim 8 wherein exposing the transistor further comprises removing an etch mask photoresist, and the first dielectric layer from over the transistor.

12. The method of claim 8 wherein siliciding the contact location further comprises depositing a metal over the contact location, and annealing the contact location.

13. The method of claim 12 wherein depositing the metal over the contact location further comprises depositing the metal comprising nickel over the contact location.

14. The method of claim 8 wherein protecting the resistor further comprises depositing the first dielectric layer comprising silicon oxide over the resistor.

15. The method of claim 8 further comprising forming a contact to the contact location after siliciding the contact location.

\* \* \* \* \*